(12) United States Patent
Torkkeli

(10) Patent No.: US 6,901,804 B2
(45) Date of Patent: Jun. 7, 2005

(54) METHOD OF MANUFACTURING A MEMBRANE SENSOR

(75) Inventor: Altti Torkkeli, Espoo (FI)

(73) Assignees: Nokia Corporation, Espoo (FI); VTI Hamlin Oy, Vantaa (FI)

( * ) Notice: Subject to any disclaimer, the term of this patent is extended or adjusted under 35 U.S.C. 154(b) by 0 days.

(21) Appl. No.: 10/239,320
(22) PCT Filed: Mar. 20, 2001
(86) PCT No.: PCT/FI01/00278
§ 371 (c)(1), (2), (4) Date: Dec. 18, 2002
(87) PCT Pub. No.: WO01/78448
PCT Pub. Date: Oct. 18, 2001

(65) Prior Publication Data
US 2003/0094047 A1 May 22, 2003

(30) Foreign Application Priority Data
Mar. 21, 2000 (FI) .............................. 20000661

(51) Int. Cl.⁷ .............................. G01L 15/00
(52) U.S. Cl. .............................. 73/716; 73/714; 29/592; 29/594; 381/175
(58) Field of Search ................. 73/700–756; 361/283.1, 361/283.4

(56) References Cited

U.S. PATENT DOCUMENTS 5,369,544 A * 11/1994 Mastrangelo ............ 361/283.4
5,679,902 A   10/1997 Ryhanen
5,944,970 A    8/1999 Rosenblatt
5,949,118 A    9/1999 Sakai et al.
6,140,689 A   10/2000 Scheiter et al.

FOREIGN PATENT DOCUMENTS

DE      40 21 661     2/1991
DE     197 41 046     5/1999

* cited by examiner

Primary Examiner—Edward Lefkowitz
Assistant Examiner—Jermaine Jenkins
(74) Attorney, Agent, or Firm—Pillsbury Winthrop LLP (57) ABSTRACT

This invention relates to a differential pressure sensor, one embodiment of which is a microphone. The differential pressure sensor comprises: a flexible membrane (7) made of conductive material, which membrane forms a first electrode of the differential pressure sensor, and a perforated plate (6) made of conductive material, which plate is essentially more rigid than said membrane (7), which plate is arranged at a distance from the membrane, and which plate forms a second electrode of the differential pressure sensor. In order to provide a differential pressure sensor with as good properties as possible, the differential pressure sensor comprises a substrate (4), a cavity (10) extending through the substrate, the walls of which cavity are formed of said substrate (4). The membrane (7) is closely connected to the walls of the cavity (10), whereby the membrane forms a dense wall in said cavity, and said perforated plate (6, 6') has been attached to the substrate with an insulating layer (5).

18 Claims, 6 Drawing Sheets

SOI WAFER
FIG. 4a

THROUGH-
ETCHING OF
SILICON
SUBSTRATE
FIG. 4b

GROWING
OF POLYSILICON
FIG. 4c

ETCHING OF
SOI LAYER
FIG. 4d

ETCHING OF
SACRIFICIAL
LAYER
FIG. 4e

METALLIZATION
FIG. 4f

ICP ETCHING OF SILICON

FIG. 5a

SHORT ETCHING OF OXIDE

FIG. 5b

WET-ETCHING OF SILICON

FIG. 5c

GROWING OF POLYSILICON

SOI WAFER

FIG. 7a

ETCHING OF
SOI LAYER

FIG. 7b

GROWING OF
CVD OXIDE

FIG. 7c

THROUGH-
ETCHING OF
SILICON
SUBSTRATE

FIG. 7d

FIG. 7e GROWING OF POLYSILICON

FIG. 7f ETCHING OF POLYSILICON

FIG. 7g ETCHING OF SACRIFICIAL LAYER

FIG. 7h METALLIZATION

ETCHING OF
SOI LAYER

FIG. 9a

SHORT ETCHING
OF SILICON LAYER

FIG. 9b

THROUGH-ETCHING OF
SILICON SUBSTRATE

FIG. 9c

GROWING OF
POLYSILICON

FIG. 9d

ETCHING OF POLY-
SILICON ON THE
FRONT SURFACE

FIG. 9e

ETCHING OF
SACRIFICIAL
SILICON OXIDE

FIG. 9f

METHOD OF MANUFACTURING A MEMBRANE SENSOR

This is the U.S. National Stage of International Application No. PCT/FI01/00278, which was filed in the English language on Mar. 20, 2001, and which designated the U.S.

This invention relates to manufacture of a capacitive membrane sensor with micro-mechanical manufacturing methods. A membrane sensor refers in this application generally to a sensor by means of which signals processed with electrical circuits can be formed, the signals being responsive to the position and/or movements of the membrane. Examples of membrane sensors include a differential pressure sensor and a microphone, which is a special case of a differential pressure sensor, functioning in the acoustic zone. In the following, the invention will be described by way of example, referring primarily to differential pressure sensors. It is to be noted, however, that the invention can also be utilized in other connections.

Figure 1:
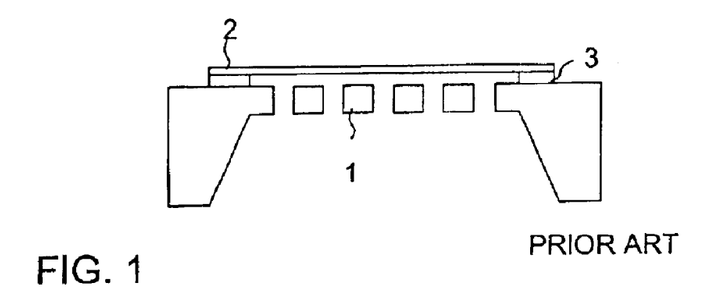
FIG. 1 shows the structure of a differential pressure sensor according to the prior art.

Known from the prior art, a differential pressure sensor shown in FIG. 1 utilizes a silicon substrate as a perforated back plate 1 of the differential pressure sensor, the back plate forming a second electrode of the differential pressure sensor. FIG. 1 shows a cross-section of a differential pressure sensor. The perforated back plate 1 is formed of a relatively thick layer of monocrystalline substrate silicon, which has been perforated by diffusion or etching in connection with the manufacture. In connection with the manufacture, an insulating layer 3 and a flexible layer 2 have been grown upon the perforated back plate 1.

The weakness of this known differential pressure sensor is that its manufacture requires a plurality of stages and masking layers. The growing of the insulating layer, among other things, requires a separate time-consuming process stage. Further, it is difficult to make the perforation of the back plate 1 optimally dense, because it is difficult to achieve an accurate pattern required by a dense perforation through the thick silicon substrate (from the lower surface in FIG. 1). A sufficiently dense perforation can be achieved for the back plate 1 by etching as a first stage pits in the silicon substrate (on the upper surface in FIG. 1), and by filling them at the growing stage of the insulating layer 3, but this method imposes special requirements on the etching profile of the perforations of the back plate 3 and for the step masking of the growing process of the insulating layer 3. Further, only small pits can be filled with this method.

The perforation of the back plate is of very great significance for the properties of the differential pressure sensor, because the perforation determines, in practice, how easily air can flow into the space below the membrane 2 of FIG. 1. If the air flow is poor, the properties of the differential pressure sensor suffer from this.

A microphone made of two or more silicon wafers by bonding, i.e. connecting, is known from the prior art. However, the manufacture of such a known microphone is very difficult.

An object of this invention is to solve the above-described problems and to provide a method which enables manufacture of a membrane sensor with improved properties in such a manner that the manufacture is easier than in the known solutions. These objects are achieved with the method according to claim 1 of manufacturing a membrane sensor, for example a differential pressure sensor or a microphone. It is to be noted that the method according to the invention does not require the steps of the method to be performed in the order presented in claim 1, but the method steps can be performed in a different order, as becomes apparent from the examples described in connection with the appended figures.

In a method according to the invention, the membrane sensor is made of a layer-structured preform having two layers, there being a layer of insulating material between them. The first and second layer can be such that they conduct electricity. One suitable preform is an SOI (Silicon-On-Insulator) wafer, which is commercially available. Making a membrane sensor of such a preform can be implemented simply by removing material from the preform, whereby only the formation of a flexible membrane requires growing of a new material layer. The manufacture of a membrane sensor according to the invention is thus easier than in known solutions.

An object of the invention is further a differential pressure sensor according to claim 8 and a microphone according to claim 13. The structure of the differential pressure sensor and microphone according to the invention allows the perforated plate to be perforated more closely than before, which improves the flow of air through the perforations, whereby the result is a differential pressure sensor and correspondingly a microphone having improved properties. Further, the structure of the differential pressure sensor and microphone according to the invention enables utilization of a novel manufacturing method, whereby the manufacturing costs of the differential pressure sensor and correspondingly of the microphone are reduced.

In a preferred embodiment of the differential pressure sensor and correspondingly the microphone according to the invention, a bridge-type structure is utilized. Thus, the area of the perforated plate functioning as the second electrode is substantially smaller than the cross-section of the cavity extending through the substrate. The perforated area of the perforated plate is arranged above the middle part of the cavity by means of arms in such a way that the perforated area is, in practice, situated above the middle part of the moving area of the flexible membrane. This bridge-type structure provides the advantage that the electrode area of the perforated plate is centred upon the most flexible middle part of membrane. Thus, the parasitic edge capacitance can be minimized, whereby improved separating capacity and sensitivity are achieved with the structure.

In a preferred embodiment of the differential pressure sensor and microphone according to the invention, a second insulating layer and a second membrane are formed upon the perforated plate. Thus, the middle part of the perforated plate is provided with a moving area that connects the membranes to each other via the insulating layers in such a way that the second membrane also moves with the membrane in the cavity. The second membrane forms an additional electrode in the structure, owing to which electrode, improved capacitance modulation and improved performance and sensitivity are achieved with the structure.

Preferred embodiments of the method, differential pressure sensor and microphone according to the invention become apparent from the attached dependent claims 2 to 7, 9 to 12 and 14 to 18.

In the following, the invention will be described in greater detail, by way of example, with reference to the attached figures, of which

Figure 2A:
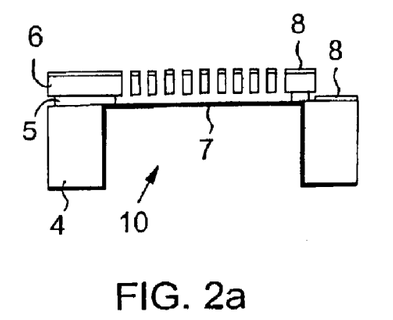
FIGS. 2a to 2c show a first preferred embodiment of a differential pressure sensor according to the invention.
Figure 2B:
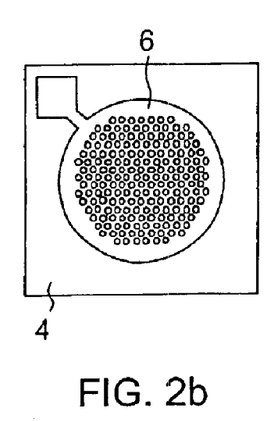
Figure 2C:
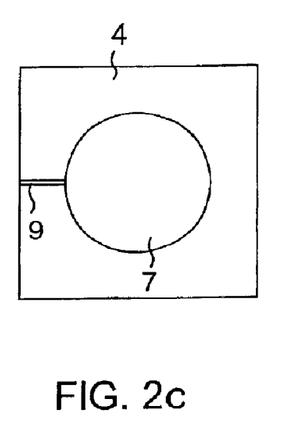

FIGS. 2a to 2c show a first preferred embodiment of the differential pressure sensor according to the invention. It is to be noted that a microphone is one embodiment of the differential pressure sensor, and therefore the description relating to the figures also concerns a microphone although the invention will later be described by referring chiefly to a differential pressure sensor.

A capacitive differential pressure sensor according to the invention is shown in FIG. 2a as a side-section, in FIG. 2b as a top view and in FIG. 2c seen from below. The differential pressure sensor of FIGS. 2a to 2c is made of an SOI wafer having an insulating layer 5 (1 to 2 μm) upon a silicon substrate 4 and a relatively thick silicon layer upon the insulating layer, which silicon layer forms a perforated plate 6 (5 to 50 μm). Up to hundreds of differential pressure sensors can be made of one SOI wafer or SOI preform, the size of the sensors being such that they can be enclosed in the enclosure of an integrated circuit when desired. Thus, the invention enables production of such an integrated circuit that includes a differential pressure sensor or a microphone.

The differential pressure sensor comprises a flexible membrane 7, which is manufactured of polycrystalline silicon. In order to connect the differential pressure sensor to an electrical circuit, metallized contact pads 8 have been formed for the perforated plate 6 and the silicon substrate 4. Through the silicon substrate, a pressure-balancing capillary 9 has been formed, which enables the pressure-balancing in microphone use.

The first electrode of the differential pressure sensor of FIGS. 2a to 2c is formed of a flexible membrane 7 arranged in a cavity 10 extending through the silicon substrate 4 in such a way that the membrane is joined to the walls of the cavity. Thus, the membrane forms in the cavity 10 a partition wall moving (bending) in accordance with pressure variations. In the embodiment of FIGS. 2a to 2c, there is also an electrical contact between the membrane 7 and silicon substrate 4. Thus, the differential pressure sensor has only two parts separated from each other, whereby not so many contacting stages are required.

The second electrode of the differential pressure sensor in FIGS. 2a to 2c is formed by the perforated plate 6. The plate is significantly more rigid than the membrane 7. Thus, the plate 6 does not move in connection with pressure variations of the plate 6 but stays still and allows air (or other substance) to flow through its perforations. The variations of the air pressure thus result in a change in the distance between the membrane 7 and the perforated plate 6, whereby an electrical signal proportional to the change can be generated from this distance change in a manner known per se when the differential pressure sensor is connected to an electrical circuit via the contact pads 8.

Figure 3:
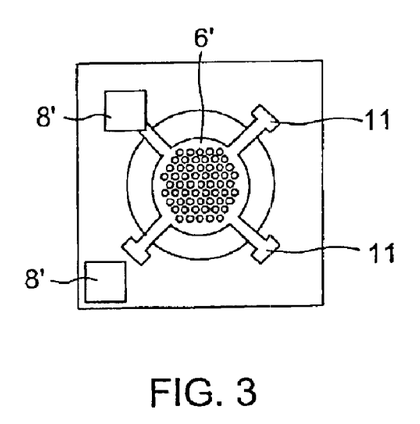
FIG. 3 shows a second preferred embodiment of a differential pressure sensor according to the invention.

FIG. 3 shows a second embodiment of a differential pressure sensor according to the invention. The differential pressure sensor of FIG. 3 is a bridge-type differential pressure sensor. This differential pressure sensor corresponds to the embodiment of FIGS. 2a to 2c in all other aspects except for the perforations of the perforated plate 6' being in the case of FIG. 3 gathered in the area situated above the middle part of the membrane 7. Only arms 11 in the plate 6' extend from the perforated area to the outside of the imaginary extensions of the walls of the cavity 10, as seen from FIG. 3.

The bridge-type structure of FIG. 3 provides the advantage that the electrode area of the plate 6' is centred upon the most flexible middle part of the membrane 7. Thus, the parasitic edge capacitance caused by the edge zones of the membrane can be minimized, whereby improved separating capacity and sensitivity are achieved.

FIGS. 4a to 4f illustrate a first preferred embodiment of a method according to the invention.

Figure 4A:
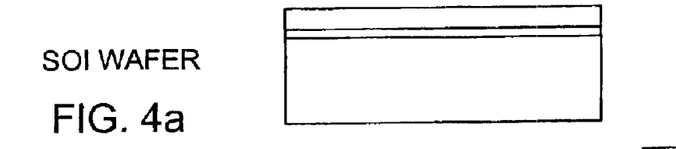
FIGS. 4a to 4f show the first preferred embodiment of the invention.
Figure 4B:
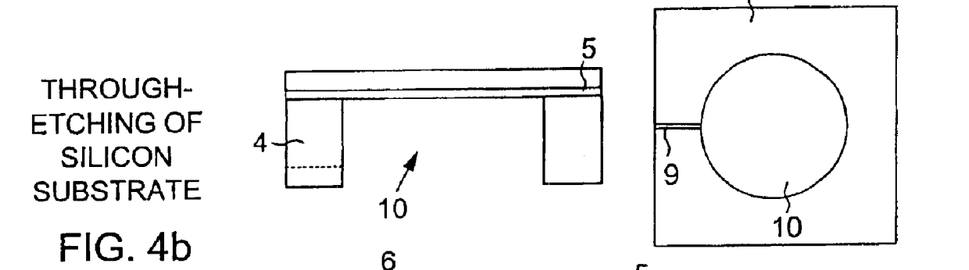

FIG. 4a shows a side view of an SOI wafer of a layered structure, and FIG. 4b shows an SOI wafer after the formation of the cavity 10 as a side-section (left-hand drawing) and as seen from below (right-hand drawing).

The cavity 10 is formed by etching. At first, the rear surface of the SOI wafer is patterned litographically, for example, after which the silicon substrate is etched until the cavity 10 extends to the insulating layer 5 of the SOI wafer. In the etching of the silicon substrate, anisotropic wet-etching can be used, for instance KOH (potassium hydroxide), or TMAH, (tetramethyl ammonium hydroxide). Alternatively, deep-etching performed with plasma (ICP, inductively coupled plasma) can be used. The ICP etching provides the advantage that the pressure-balancing needed in microphone use can be implemented with a narrow groove 9, which is etched at the same stage as the cavity 10 extending through the silicon substrate.

The use of ICP etching for forming a cavity extending through the substrate also brings about the advantage that the shape of the flexible membrane can be optimized. In conventional anisotropic wet-etching of silicon, it is necessary to be confined to rectangular membranes. However, a circular membrane, for instance, bends 20% more than a square membrane having the same area. Also, in a circular membrane, the border line has been minimized relative to the area, whereby the parasitic edge capacitance is reduced.

Figure 4C:
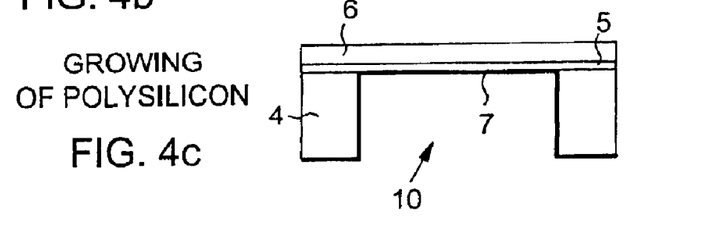

FIG. 4c illustrates growing of a flexible membrane 7. The flexible membrane can be made of polysilicon (polycrystalline silicon) by growing, for example with the CVD (chemical vapour deposition) method. The flexible membrane 7 grows evenly on all vacant surfaces. The thickness of suitable polysilicon is approximately one micrometer. Polysilicon also grows on the lower surface of the substrate 4 and on the upper surface of the plate 6, but, according to the invention, it does not have to be removed.

FIG. 4c shows that in connection with the growing of the flexible membrane, the polysilicon only grows in the cavity and on the lower surface of the substrate. In reality, polysilicon can also grow on the upper surface of the perforated plate 6 (depending on the method used) in connection with the growing of the membrane 7. The polysilicon grown on the surface of the perforated plate does not have to be removed, but it can be left where it is, whereby it forms a part of the perforated plate.

Deviating from the embodiment of FIGS. 4a to 4f, the insulating layer can be made rougher prior to the growing of the membrane by etching the insulating layer through the cavity. Thus, the surface of the membrane becomes rough after growing. This brings about the advantage that the membrane does not adhere to the perforated plate during the use of the pressure sensor as easily as a smooth membrane. The tension of the membrane 7 can be controlled with thermal treatment, and the alloy can be made conductive during the growing stage or afterwards with ion implantation or diffusion. The membrane 7 forms an electrical contact with the substrate 4.

If an air gap thicker than the insulating layer 5 of the SOI wafer is to be achieved between the membrane 7 and the perforated plate 6 in the differential pressure sensor, the thickness of the insulating layer can in such a case be increased through the cavity 10 prior to the growing of the membrane 7. The thickness of the insulating layer can be grown with CVD oxide, for example.

Figure 4D:
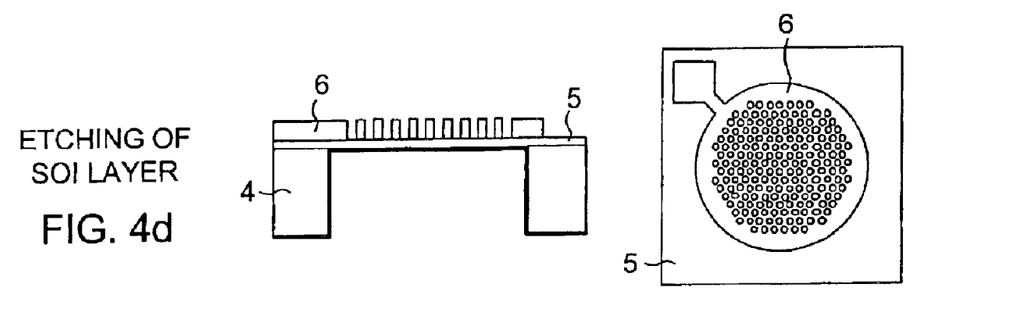

FIG. 4d illustrates formation of perforations in the perforated plate 6. In FIG. 4d, the preform is seen as a side-section (left-hand drawing) and from above (right-hand drawing).

Perforations are formed in the perforated plate 6 by etching. At first, the desired pattern is patterned litographically on the surface of the plate, using two-sided focusing. After this, the perforations are etched on the plate 6 as far as to the insulating layer 5. Anisotropic wet-etching or ICP etching can be used in the etching. The ICP etching provides the advantage that the perforation can be made optimally dense, and in addition, the etching can utilize what is called a notching phenomenon of the ICP etching, whereby the acoustic resonance of the air gap of the microphone is reduced (cf. FIG. 6). Further, the adherence risk of the flexible membrane is reduced owing to the smaller contact area.

Deviating from the right-hand drawing of FIG. 4d, the perforated back plate 6 can also be made bridge-like, as shown in FIG. 3.

Figure 4E:
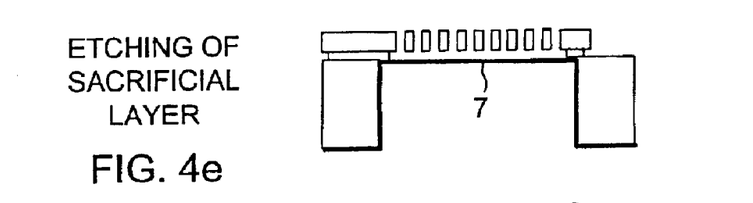

FIG. 4e illustrates removal of the insulating layer. The insulating layer is removed by etching in a solution which etches out the insulating layer from the area between the membrane and the perforated plate, but which does not essentially remove material from the substrate of the perforated plate. The material of the insulating layer in the SOI wafer can be for instance silicon dioxide, in which case for instance the HF solution (hydrofluoric acid) or the PSG solution (ammonium fluoride, acetic acid, water) are suitable for its removal.

The etching relating to the removal of the insulating layer also proceeds below the outer edges of the perforated plate in the side direction as much as in the area of the flexible membrane, but because the distance between the perforations of the perforated plate is only a few micrometers, this phenomenon is not detrimental. After the removal of the insulating layer, the membrane 7 is disengaged in such a way that it can move (stretch) in the cavity.

Figure 4F:
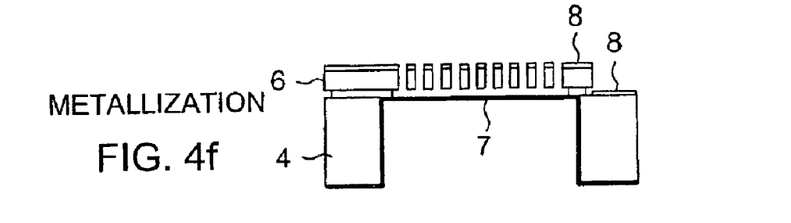

FIG. 4f illustrates metallization of a differential pressure sensor manufactured with a method according to the invention. Since a relatively thick layer of an SOI wafer is used as the perforated plate 6, the metallization can be performed as the last step without a mask. The metallization can be done by sputtering a thin layer of metal (e.g. aluminium) without the stress or thermal expansion of the metal being detrimental. An appropriate thickness for the metal is half of the thickness of the insulating layer, whereby the metallization is not capable of short-circuiting the perforated plate 6 and the substrate 4. At the points of the perforations in the perforated plate, metal spots are formed on the membrane 7 as well, but not forming a continuos membrane, the metal spots do not cause significant stress.

Deviating from the above, the metallization can be performed with a mask, whereby no metal spots are formed on the membrane, and the thickness of the metal layer can be increased without the risk that it would short-circuit the plate 6 and the substrate 4. At least in connection with a bridge-type perforated plate, there is a reason to use a mechanical mask, in which case contact metal is only gathered in the area of the contact pads 8.

FIGS. 5a to 5d illustrate a second preferred embodiment of a method according to the invention. The other parts of the embodiment of FIGS. 5a to 5d correspond to the embodiment of FIGS. 4a to 4f, but instead of the kind of cavity formation implemented in FIG. 4b, the cavity is formed through the intermediate steps of FIGS. 5a to 5c.

Figure 5A:
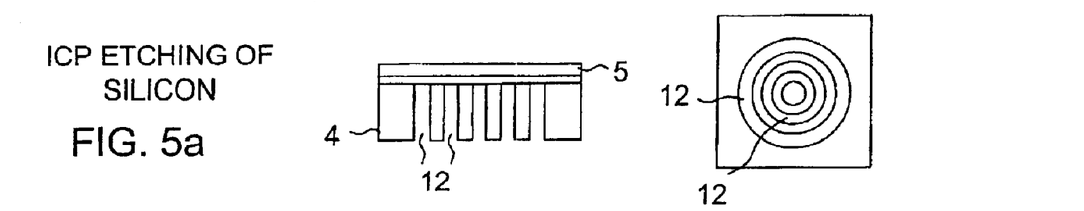
FIGS. 5a to 5d show the second preferred embodiment of the invention.

In FIG. 5a, a plurality of rings 12 are etched within each other in the substrate in such a way that they extend through the substrate 4 as far as to the insulating layer 5. The rings can be etched for example by using ICP etching.

Figure 5B:
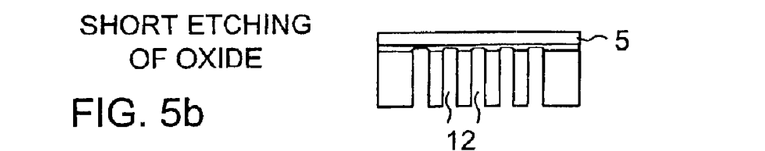

In FIG. 5b, the thickness of the insulating layer 5 has been made thinner by etching, whereby some material has been removed through the rings 12. After this, the step according to FIG. 5c follows, in which the walls between the rings 12 are removed with wet-etching in such a way that a continuous cavity 10 is formed in the substrate.

Figure 5C:
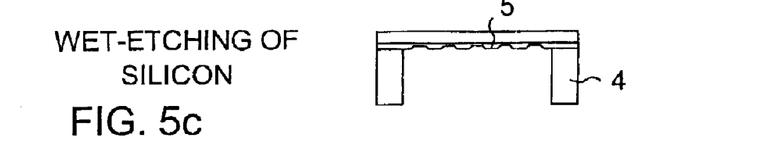
Figure 5D:
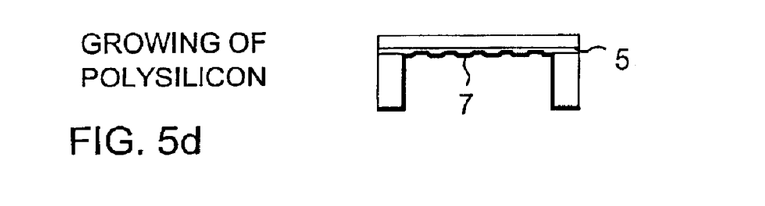

In FIG. 5c it is seen that grooves have been formed on the surface 5 of the insulating layer. When at the following manufacturing stage the membrane 7 is grown on the surface of the insulating layer 5 (in the way corresponding to that described in connection with FIG. 4c), a corrugated, i.e. a winding membrane 7, is provided. When the membrane is subsequently disengaged from the insulating layer above it by etching out the insulating layer in the way described in connection with FIG. 4e, the result is that with the embodiment according to FIGS. 5a to 5d, a membrane is provided which has less stress than the membrane of the differential pressure sensor manufactured in accordance with FIGS. 4a to 4f.

Figure 6:
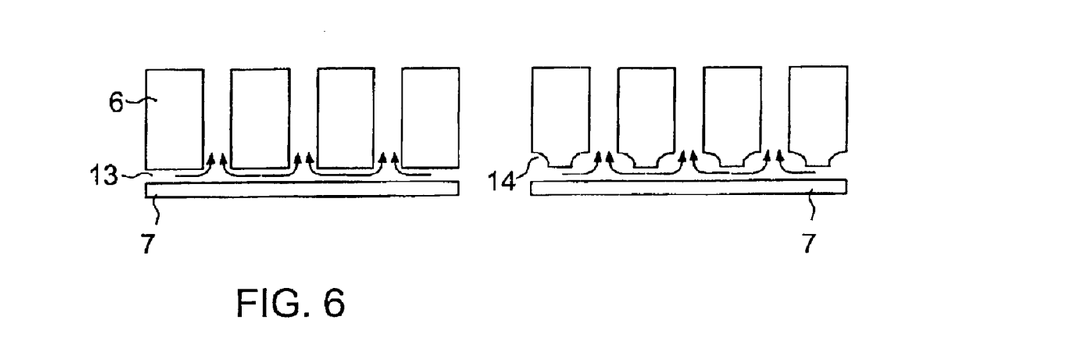
FIG. 6 shows reduction of the acoustic resistance of a microphone according to the invention.

FIG. 6 illustrates decreasing of the acoustic resistance of a microphone according to the invention. FIG. 6 shows the lower part of the perforated plate 6 and the membrane 7. In FIG. 6, arrows indicate the flow of air in the slot between the plate 6 and the membrane 7. In the left-hand drawing, the angles of the walls between the perforations of the perforated plate 6 are acute, whereby the air flow is poorer than in the right-hand drawing, in which the angles 14 are blunt.

The blunting of the angles 14 is based on the notching phenomenon mentioned in connection with FIG. 4d. The notching phenomenon means that over-etching results in side-directed cavities. Such cavities are provided when the ICP etching of FIG. 4d, in which perforations are formed in the perforated plate, is carried on for a sufficiently long time, in other words even after the perforations have reached the insulating layer.

FIGS. 7a to 7i illustrate a third preferred embodiment of a method and differential pressure sensor according to the invention. The embodiment of FIGS. 7a to 7i differs from the one of FIGS. 4a to 4f in such a way that in the case of FIGS. 7a to 7i, additional steps are performed, which are illustrated in connection with FIGS. 7b to 7c and owing to which an additional electrode is provided in the differential pressure sensor.

Figure 7A:
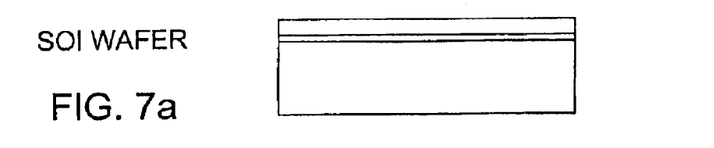
FIGS. 7a to 7i show a third preferred embodiment of the method and differential pressure sensor according to the invention.

FIG. 7a shows a layer-structured SOI wafer which can be utilized in the manufacture of a differential pressure sensor. Thus, it is a preform corresponding to the one in the embodiment of FIGS. 4a to 4f.

Figure 7B:
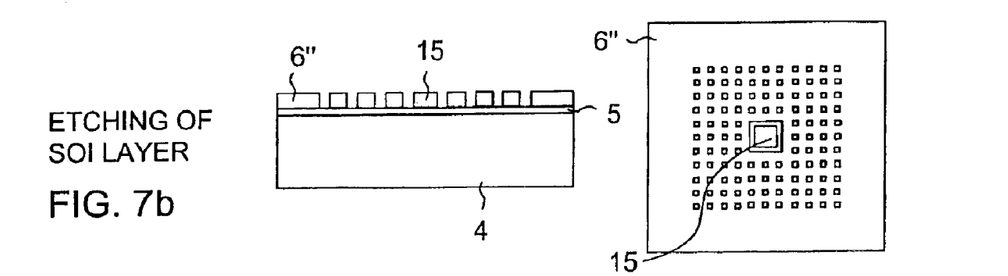

In the step of FIG. 7b, the manufacture of the differential pressure sensor is started by perforating the perforated plate 6" of the differential pressure sensor by etching, in the manner corresponding to that described in connection with FIG. 4d. In the left-hand drawing of FIG. 7b the SOI wafer is seen as a side-section and in the right-hand drawing as a top view. In the case of FIG. 7b, such a pattern is formed on the perforated plate 6" that comprises an armature area 15 situated in the middle part of the perforated plate 6" and separated from the rest of the layer.

Figure 7C:
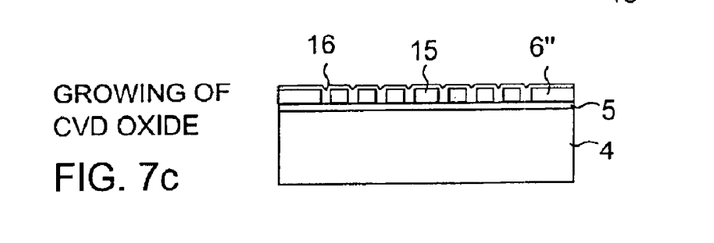

In the step of FIG. 7c, the perforations of the perforated plate 6" and the groove surrounding the armature area 15 are filled by growing with CVD oxide, for example. The oxide forms at the same time a second insulating layer 16 upon the perforated plate 6".

After the growing of the second insulating layer 16, the manufacture of the differential pressure sensor is continued with steps corresponding to those described in FIGS. 4b to 4f. At first, the cavity 10 is etched in the step of FIG. 7d. In the left-hand drawing of FIG. 7d the differential pressure sensor is seen as a side-section and in the right-hand drawing from below.

Figure 7D:
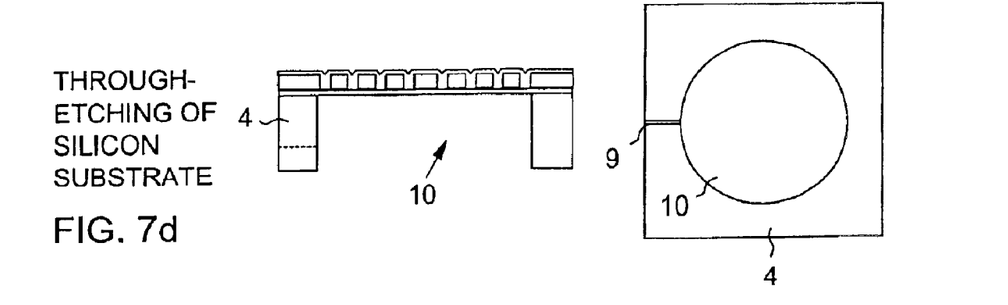

In connection with the manufacture of a microphone (which is a special embodiment of a differential pressure sensor), the structure must be provided with a pressure-balancing opening that opens to the cavity 10. The pressure-balancing opening 9 can be etched in connection with the etching of the cavity 10 from the cavity 10 through the substrate 4 on the outer surface of the substrate, as shown in FIG. 7d. Alternatively, if it is not desirable to arrange the pressure-balancing opening through the substrate, as in the figure, it can be implemented in accordance with the invention in such a way that the membrane 7 is provided with a perforation that allows air to flow between the spaces between the upper and lower parts of the membrane. Such a pressure-balancing perforation can be made in the membrane for instance by puncturing with laser, or alternatively, by etching from the upper or lower part of the membrane, using a photoresist mask.

Figures 7E, 7F:
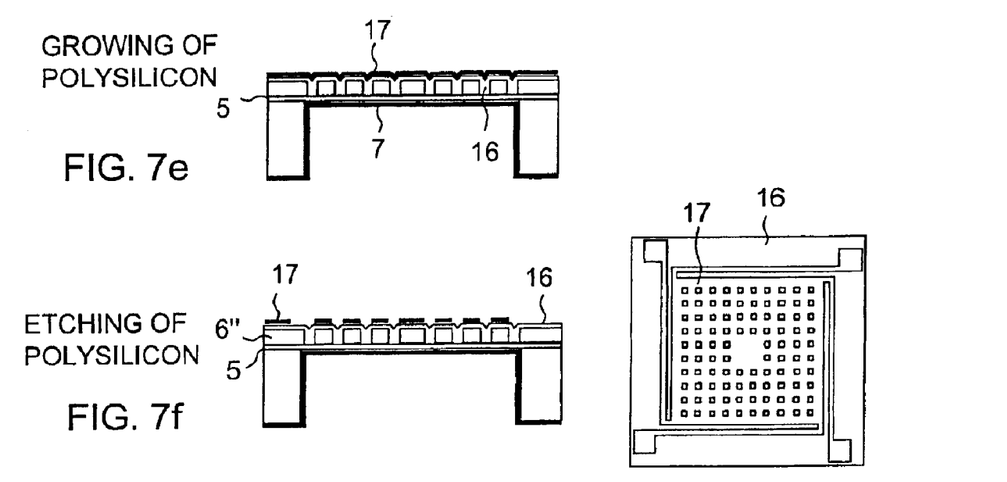

In the step of FIG. 7e, a flexible membrane 7 is grown of polysilicon in the way corresponding to that described in connection with FIG. 4c. It is seen from FIG. 7e that in connection with the growing of the flexible membrane 7, a second membrane 17 grows at the same time of polysilicon upon the second insulating layer 16.

In the step of FIG. 7f, the second flexible membrane 17 is grown upon the second insulating layer 16 in such a way that a perforated additional electrode is formed of the flexible membrane 17. The left-hand drawing of FIG. 7f shows the differential pressure sensor as a side-section and the right-hand drawing as a top-view.

Figure 7G:
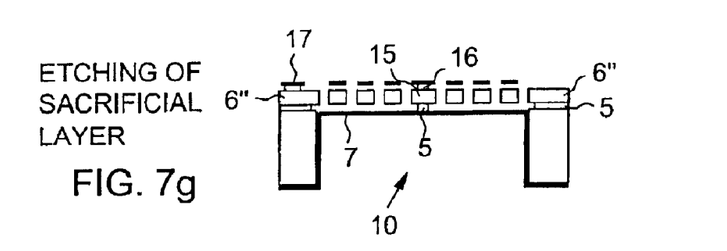

In the step of FIG. 7g, the insulating layers 5 and 16 are removed for instance by etching in an HF solution, in the way corresponding to that described in connection with FIG. 4e. Thus, the insulating layers 5 and 16 can be removed from the area between the perforations and the cavity 10 in such a manner that some insulant 5 and 16 remains in the middle of the armature area 15. Thus, the second flexible membrane 17, i.e. the additional electrode, remains connected to the flexible membrane 7 via the armature area 15, and the armature area 15, in turn, becomes separated from the perforated plate 6".

Figure 7H:
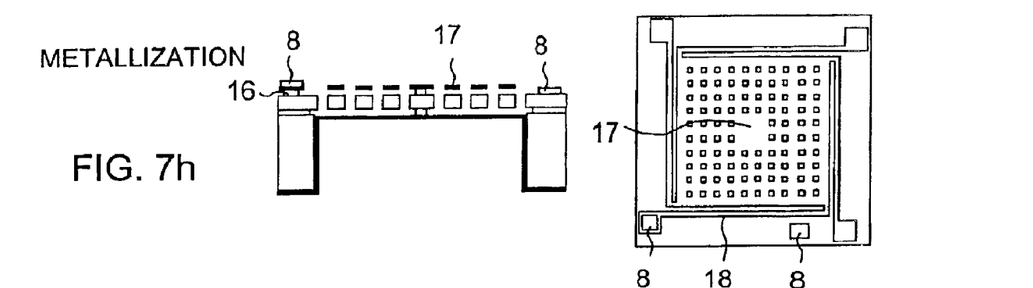

Finally, in the step of FIG. 7h, contact metallization is performed with a mechanical mask, whereby contact pads 8 can be formed in the differential pressure sensor. FIG. 7f shows the differential pressure sensor in the left-hand drawing as a cross-section and in the right-hand drawing as a top view.

Figure 7I:
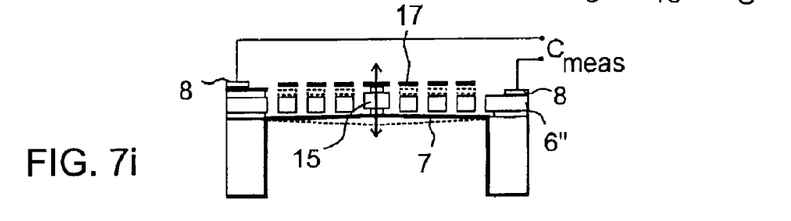

The changing capacitance $C_{meas}$ of the additional electrode structure formed by the second flexible membrane 17 is measured from the contact pads 8 between the perforated plate 6" and the second flexible membrane 7 in accordance with FIG. 7i. Since the second flexible membrane 17 is connected to the middle of the flexible membrane 7 via the armature area 15, it moves as a plane-like panel as much as the most flexible middle part of the flexible membrane 7. Thus, greater capacitance modulation and improved separating capacity and sensitivity are achieved.

In order to form an electrical contact, the additional electrode formed by the second flexible membrane 17 is patterned in such a way that a thin conductor 18 extends from the perforated area thereof to the contact pad, as seen in FIG. 7h, for instance. The conductor 18 must be slender so as to prevent the movement of the second flexible membrane 17 as little as possible. In order to prevent torsion, it is desirable that there are conductors symmetrically placed. The shape of the second flexible membrane 17 illustrated in FIG. 7h and the arrangement of its four conductors are exemplary; arms having other shapes can be used as well.

Figure 8:
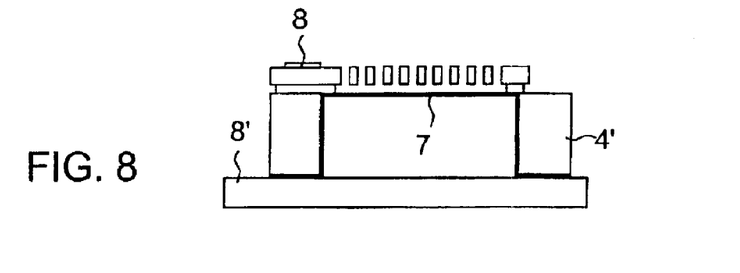
FIG. 8 shows a fourth preferred embodiment of the differential pressure sensor according to the invention.

FIG. 8 illustrates a fourth preferred embodiment of a differential pressure sensor according to the invention. The embodiment of FIG. 8 deviates from the preceding embodiments in that it utilizes a substrate 4', which does not conduct electricity. Thus, the flexible membrane 7 is connected to an electricity-conducting base 8', which forms a first contact pad of the membrane sensor according to FIG. 8. A second contact pad 8 is, by contrast, arranged on the surface of the perforated plate, as described in connection with previous embodiments.

Although it has been explained in connection with previous embodiments of the invention that a conductive substrate is used in the differential pressure sensor, it is to be noted that this is only one option. Instead of a conductive substrate, a conductive base like the one in FIG. 8 can be used in the embodiments described above, the base being connected to the flexible membrane, and thus also a substrate that does not conduct electricity can be used.

FIGS. 9a to 9f illustrate a fourth preferred embodiment of a method and differential pressure sensor according to the invention. The embodiment of FIGS. 9a to 9f corresponds to a great extent to the embodiment of FIGS. 4a to 4f. The most significant difference is that in the case of FIGS. 9a to 9f, a part of the steps relating to the method are performed in a deviating order, in addition to which, a few extra steps are performed to form adhesion prevention collars.

Figure 9A:
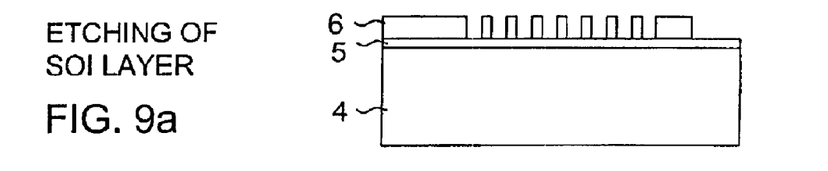
FIGS. 9a to 9f show a fourth preferred embodiment of the method and differential pressure sensor according to the invention.

In the embodiment of FIGS. 9a to 9f, the differential pressure sensor can be made of an SOI wafer corresponding to that described in connection with FIGS. 4a to 4f. In the step of FIG. 9a, perforations are made in the perforated plate 6 by etching.

Figure 9B:
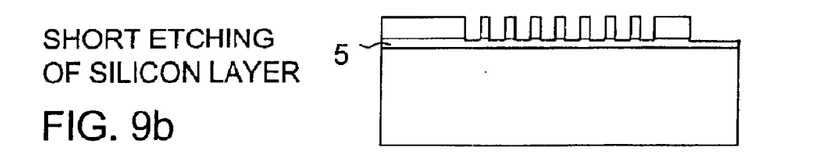

In the step of FIG. 9b, the insulating layer 5 formed of silicon dioxide, for example, is etched shortly, i.e. in such a way that pits are formed in it at the points corresponding to the points having perforations in the perforated plate 6.

Figure 9C:
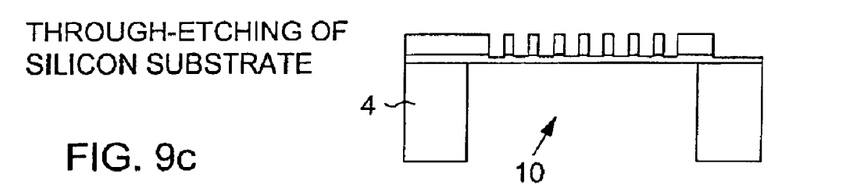

In the step of FIG. 9c, a cavity 10 is etched in the substrate 4, as described in connection with the previous embodiments.

Figure 9D:
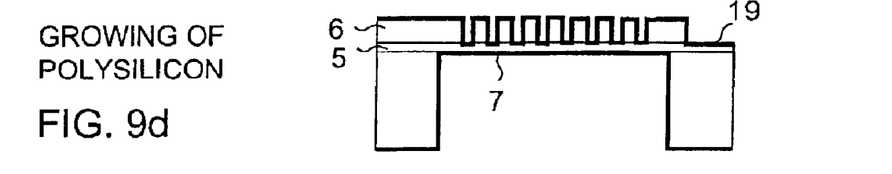

In the step of FIG. 9d, a flexible membrane 7 is grown of polysilicon, for instance, for the insulating layer through the cavity 10. Simultaneously, a layer 19 of polysilicon grows on the perforated plate 6 and on the visible upper surface of the insulating layer 5 seen in FIG. 9d. On the upper surface of the insulating layer, a layer 19 of polysilicon only grows at the points of the perforations of the perforated plate 6.

Figure 9E:
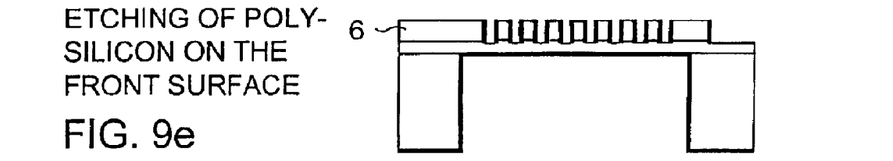

In the step of FIG. 9e, a polysilicon layer 19 is etched out from the upper surface of the perforated plate 6 seen in FIG. 9e. The etching can be implemented as plasma etching. Plasma etching typically etches horizontal surfaces much more rapidly than vertical surfaces. Thus, some polysilicon remains on the side surfaces of the perforated plate 6.

Figure 9F:
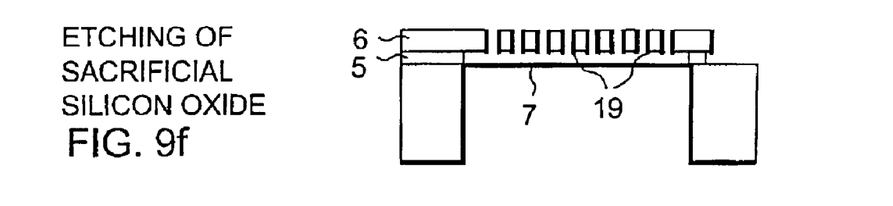

In the step of FIG. 9f, the insulating layer 5 has been removed, for example by etching. It is seen from FIG. 9f that the polysilicon layer 19 remaining on the side surfaces of the perforations of the perforated plate 6 protrudes to some extent from the perforated plate 6 towards the membrane 7. These protrusions of the polysilicon layer 19 thus form collars that reduce the adhesion sensitivity of the membrane 7, in other words they prevent the membrane from adhering to the perforated plate 6.

It is to be understood that the above description and the related figures are only intended to illustrate the present invention. Different variations and modifications of the invention will be obvious to a person skilled in the art, without deviating from the scope and spirit of the invention defined in the attached claims.

What is claimed is:

1. A method of manufacturing a membrane sensor, comprising
    selecting into use a layer-structured preform comprising a first layer, a second layer made of conductive material, and an insulating layer between the first and second layers;
    removing material from the first layer by etching a cavity in the first layer, the cavity extending through the first layer as far as to the insulating layer;
    growing a membrane of conductive material on the insulating layer through the cavity formed in the first layer, the membrane joining to the walls of the cavity, forming a dense wall in the cavity;
    removing material from the second conductive layer by etching perforations in the second conductive layer, the perforations extending through the second conductive layer as far as to the insulating layer and being situated in a finished membrane sensor at the point of the cavity but on the side opposite to the insulating layer; and
    removing the insulating layer from the area between the perforations and the cavity.

2. The method of claim 1, wherein the first layer being of conductive material and by further metallizing in the method an area in the first and second layers to form contact pads enabling electrical connections.

3. The method of claim 1, further comprising selecting in the method a layer-structured SOI preform into use, the first layer of which preform is formed of a silicon substrate upon which an insulating layer has been arranged and the second conductive layer of which is formed of a silicon layer.

4. The method of claim 1, further comprising growing said membrane of polycrystalline silicon.

5. The method of claim 1, further comprising enclosing the membrane sensor in the enclosure of an integrated circuit.

6. The method of claim 1, further comprising making the insulating layer rougher in the method by etching through the cavity prior to the growing of the membrane.

7. The method of claim 1, wherein:
    the etching of the perforations in the second layer is performed prior to the removal of material from the first layer, whereby an armature area separated with grooves from the other parts of the second layer is formed in the middle part of the second layer;
    growing a second insulating layer upon the second layer when the second layer has been perforated; and
    after the formation of the cavity, a second conductive membrane is grown upon the second insulating layer in connection with the growing of the conductive membrane, and openings are etched in said second membrane which extend through the second membrane to the second insulating layer, whereby in connection with the removal of the insulating layer, also the second insulating layer is removed in such a way that a differential pressure sensor is provided having two flexible membranes connected to each other via the armature area.

8. A differential pressure sensor comprising
    a flexible membrane made of conductive material, which membrane forms a first electrode of the differential pressure sensor; and
    a perforated plate made of conductive material, which plate is essentially more rigid than said membrane, which plate is arranged at a distance from the membrane, and which plate forms a second electrode of the differential pressure sensor, wherein
    the differential pressure sensor also comprises a substrate, a cavity extending through the substrate, the walls of which cavity are formed of said substrate;
    the membrane is closely joined to the walls of the cavity, whereby the membrane forms a dense wall in said cavity, and
    said perforated plate is attached to the substrate with an insulating layer.

9. The differential pressure sensor of claim 8, wherein the differential pressure sensor is made of a layer-structured SOI preform, whereby the substrate is formed of a silicon substrate of the SOI preform; the insulating layer is made of an insulating layer of the SOI preform; and the perforated plate is made of a silicon layer of the SOI preform.

10. The differential pressure sensor of claim 8, wherein said membrane is made of polycrystalline silicon.

11. The differential pressure sensor of claim 8, wherein
    the area of the perforated plate is essentially smaller than the area of the cross-section of the cavity; and
    when the differential pressure sensor is seen from the direction of the perforated plate, the perforated area of the perforated plate is situated above the middle part of the moving area of the flexible membrane, and from said perforated area, only arms supporting said perforated area extend past imaginary extensions of the side walls of the cavity.

12. The differential pressure sensor of claim 8, wherein
    a second flexible membrane, which is perforated, has been attached to the perforated plate on the side opposite relative to the substrate with a second insulating layer, and
    an armature area separated from the other parts of the perforated plate with a groove has been formed in the middle part of the perforated plate, which armature area is connected to the flexible membrane and to the second flexible membrane in such a way that the movement of the flexible membrane is transmitted through the armature area to the second flexible membrane, which moves with the membrane.

13. A microphone comprising:
    a flexible membrane made of conductive material, which membrane forms a first electrode of the microphone; and
    a perforated plate made of conductive material, which plate is essentially more rigid than said membrane, which plate is arranged at a distance from the membrane, and which plate forms a second electrode of the microphone, wherein
    the microphone further comprises a substrate, a cavity extending through the substrate, the walls of which cavity are formed of said substrate;

the membrane is closely joined to the walls of the cavity, whereby the membrane forms a wall in said cavity; and said perforated plate has been attached to the substrate with an insulating layer.

14. The microphone of claim 13, wherein the microphone is made of a layer-structured SOI preform, whereby the substrate is formed of a silicon substrate of the SOI preform; the insulating layer is made of an insulating layer of the SOI preform, and the perforated plate is made of the silicon layer of the SOI preform.

15. The microphone of claim 13, wherein said membrane is made of polycrystalline silicon.

16. The microphone of claim 13, wherein the area of the perforated plate is essentially smaller than the area of the cross-section of the cavity; and when the microphone is seen from the direction of the perforated plate, the perforated area of the perforated plate is situated above the middle part of the moving area of the flexible membrane, and from said perforated area, only arms supporting said perforated area extend past the imaginary extensions of the side walls of the cavity.

17. The microphone of claim 13, wherein a pressure-balancing opening opens to the cavity, which pressure-balancing opening extends from the cavity through the substrate to the outer wall of the substrate, or which pressure-balancing opening is formed of a perforation in the membrane, the perforation connecting the space above the membrane to the space below the membrane.

18. The microphone of claim 13, wherein a second flexible membrane, which is perforated, has been attached to the perforated plate on the side opposite relative to the substrate with a second insulating layer, and an armature area separated from the other parts of the perforated plate with a groove has been formed in the middle part of the perforated plate, which area is connected to the flexible membrane and to the second flexible membrane in such a way that the movement of the flexible membrane is transmitted through the armature area to the second flexible membrane, which moves with the membrane.

* * * * *